May 20, 1958 M. H. FIRST ET AL 2,835,874

ELECTRICAL INTERFERENCE SUPPRESSION FILTER

Filed Feb. 17, 1954

INVENTORS.
MERVIN H. FIRST
LEONARD MILTON
BY
Zoltan Polachek
ATTORNEY

United States Patent Office 2,835,874

Patented May 20, 1958

2,835,874

ELECTRICAL INTERFERENCE SUPPRESSION FILTER

Mervin H. First, Brooklyn, and Leonard Milton, Jackson Heights, N. Y., assignors, by direct and mesne assignments, to J. & G. Development Corporation, Culver City, Calif., a corporation of California Application February 17, 1954, Serial No. 410,952

16 Claims. (Cl. 333—79)

The present invention relates generally to electrical interference suppression filter devices and, more particularly, to radio frequency interference suppression filter structures adapted to attenuate a wide range of high-frequency signals, or voltages.

For an interference filter to be effective, its attenuation characteristics must be relatively high throughout the entire range of interfering signals, otherwise a substantial portion of these signals will pass through the filter to be intercepted by radio receivers and other electronic equipment. This would interfere with the reception of the desired signals and could cause malfunctioning of the other electronic equipment.

It has been found that with conventional filter structures designed for this purpose, such as "Pi," "L," or constant "K" type, the filter is most effective only over the lower portion of the frequency range. The reason for this resides in the fact that as the interfering frequency is increased, the stray capacitive and inductive coupling existing between the leads within the filter network constitutes a low impedance path which passes the high-frequencies, thereby reducing the effective attenuation of the filter in the higher portion of the range. The stray coupling effect becomes more pronounced the higher the frequency.

Accordingly, it is the principal object of the invention to provide an improved filter structure adapted to attenuate a wide range of interfering signals.

More specifically, it is an object of the invention to provide a shielded filter structure having a high attenuation characteristic from the high to low frequency portion of the range of interfering signals to be attenuated.

It is also an object of the invention to provide in a filter structure of the above type, shielding means adapted to minimize stray coupling effects between the internal input and output leads of the filter so that a very substantial amount of electrical separation between the leads is realized within the confines of the filter housing.

A further object of the invention is to provide a "Pi" type filter structure comprising a series connected choke in conjunction with shunt capacitors, wherein the terminal leads are effectively shielded from each other by separate shielding compartments.

It is a further object of the invention to provide a highly compact and well shielded filter structure which may be manufactured and sold at a reasonable cost.

Briefly, these objects are accomplished by the invention which is embodied in filter apparatus comprising a metallic housing having two terminals mounted in openings in and insulated from the metallic housing. A radio frequency shielding compartment is provided comprising a shield wall in permanent electrical contact with the inside of the metallic housing. A feed-thru capacitor is arranged on one side of the shield wall with its lead, which passes through the capacitor, continuing through an opening in the shield wall and connecting to the terminal. Shielding means are provided for shielding the lead between the feed-thru capacitor and the opening; for example, by covering the opening with the end of the feed-thru capacitor. Means such as an inductor connect the feed-thru capacitor to the remaining terminal. The terminals are arranged to avoid the coupling of radio frequency energy from one to the other on the outside of the metallic housing.

A second feed-thru capacitor and shield wall may be employed in a similar manner for a "Pi" type filter network.

Thus, stray coupling from the leads which would permit radio frequency energy to by-pass components of the filter is minimized resulting in a filter which is particularly effective to suppress a wide frequency range of undesirable signals.

An advantage of the embodiment of the invention in which the end of the feed-thru capacitor covers the opening in the shield wall is that the shield wall provides support for the feed-thru capacitor which results in a compact and rigid structure.

Other objects, features and advantages of the invention will be apparent on reading the following description which is accompanied by a drawing wherein.

Figures 1, 2, 3, 4, 5, 6, 7, 8:
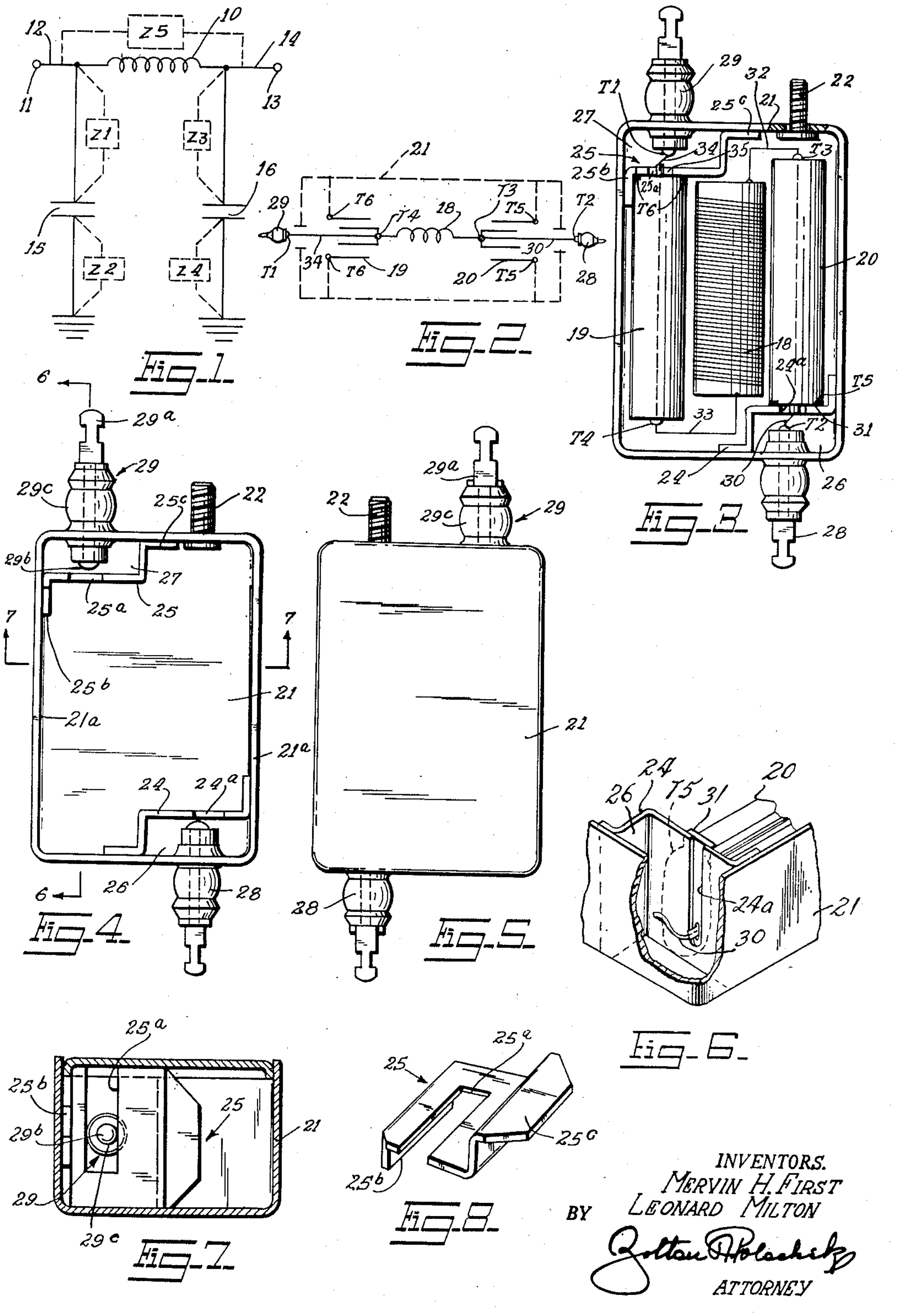
Fig. 1 is a schematic diagram of a conventional "Pi" type filter network.
Fig. 2 is a schematic wiring diagram of a shielded "Pi" type filter network in accordance with one embodiment of the invention.
Fig. 3 is a bottom plan view of a shielded filter structure in accordance with the same embodiment of the invention with cover removed, illustrating how the grounded electrode of each feed-thru capacitor shields the opening in the associated shield wall.
Fig. 4 is a bottom plan view of the shielded filter structure with the electrical components removed.
Fig. 5 is a top plan view of the shielded filter structure.
Fig. 6 is a perspective view of one corner of the shielded filter structure, partly broken away, showing how the electrode of the feed-thru capacitor shields the opening in the shield wall.
Fig. 7 is a longitudinal section taken along the line 7—7 in Fig. 4, but with the cover in place showing how the cover completes the shielding.
Fig. 8 is an enlarged perspective view of one of the shield partition members which comprises the shield wall.

Referring now to Fig. 1, there is disclosed a conventional "Pi" type filter network comprising a radio frequency choke 10 connected to an input terminal 11 by a lead 12 and to an output terminal 13 by a lead 14. Connected between ground and the input and output ends of choke 10 are capacitors 15 and 16, the several components having parameters adapted to provide a low impedance path between input and output terminals 11 and 13 for the rated current, while effecting attenuation of interfering high-frequency signals, or R. F. voltages, within a predetermined range. Inasmuch as the various components and connecting leads forming the filter network are ordinarily housed in a metal container, it will be found that the proximity of lead 12 to lead 14 will result in stray coupling therebetween as shown by impedance "Z5," which reduces the attenuation of the network in the high-frequency portion of the interfering range. Lead lengths of capacitors 15 and 16 increase each of the impedances, Z1, Z2, Z3 and Z4 which reduce the resonant frequency of the capacitors. This makes the filter predominantly of the "M" derived type which has a characteristic lowering of attenuation as frequency increases after reaching a maximum attenuation peak. The higher the frequency of the interfering signal, the more serious is the stray coupling and lead length effect and the lower the resultant attenuation.

In filter networks as ordinarily built, there are always present certain stray couplings between the component elements and wiring. These couplings impair the attenuation characteristics of the network by changing the values of the lumped impedance elements, their resonant frequencies, and also by introducing additional paths for the currents. These harmful effects are especially noticeable in filter networks designed for use at high frequencies.

These couplings may be decreased in magnitude, to a certain extent, by a physical separation of the elements and wiring, but there are obvious limits to the extent to which this method can be employed practically.

In accordance with one embodiment of the invention, these difficulties are overcome by the use of wound non-inductive type feed-thru capacitors grounded over the lead opening in a shield wall. The shield wall shields the lead between the capacitor and the inner section of the terminal. The outer foil of the feed-thru capacitor is grounded, thus self-shielding this element. Therefore, internal coupling between the input and output terminals and leads is substantially reduced resulting in high attenuation, particularly in the high frequency range.

The invention provides, as shown schematically in Fig. 2 and structurally in various views in Figs. 3 to 8 (wherein like components are represented by like reference numerals), a high-frequency interference suppression filter device consisting of a "Pi" type network formed by an inductor such as the radio-frequency choke coil 18 (Fig. 3) which may be solenoid or toroidal, variations thereof or combined, and a pair of feed-thru capacitors 19 and 20. Feed-thru capacitors 19 and 20 may comprise metalized paper or metalized synthetic film, or paper-foil, or synthetic film-foil, or electrolytic, unimpregnated or impregnated in resin, wax, oil, synthetic oil or other suitable liquid or solid impregnants. These electrical components are contained within a metallic housing such as can 21. While can 21 is shown as rectangular, it may be cylindrical or other suitable shape.. The can 21 is provided with a suitable mounting method such as mounting a screw 22 for securing the filter device to a grounded chassis or other grounded base. Choke coil 18 is disposed centrally in the can and capacitors 19 and 20 are disposed along opposing sides of the choke coil 18.

Mounted within can 21 at either end thereof are shield walls 24 and 25 which may be in the form of metal partitions (Figs. 3 and 4) each in permanent electrical contact with the walls of the can 21 to define radio frequency shielded compartments 26 and 27 within the can 21. The radio frequency shielding compartments are in diagonally opposed corners of the can 21. Mounted at one end of the can 21 and extending into the shielded compartment 26 is the stand-off terminal 28 and mounted at the other end of can 21 and extending into the shielded compartment 27 is the stand-off terminal 29. The terminals 28 and 29 are insulated from the can 21.

Capacitors 19 and 20 (Figs. 3) are housed in insulating boxes which, for example, may be made of impregnated paper or of synthetic film and are of the so-called non-inductively wound feed-thru type. As shown schematically in Fig. 2, one electrode of capacitor 19 is connected to the choke coil 18 and to a wire running or feeding through a longitudinal hole in the capacitor 19 to terminal contact T1 of terminal 29. The other electrode (Fig. 3) is electrically connected over the opening in the shield wall 25, the shield wall 25 being grounded. In a similar manner, capacitor 20 is provided with contacts to the choke coil 18 and to terminal T2 of terminal 28 with its grounded electrode over the opening in shield wall 24 (Fig. 6).

The nongrounded electrodes of the capacitors 19 and 20 and the choke coil 18 are not in electrical contact with the can 21 in order to prevent shorting of the components and wiring.

The terminal 28 (Figs. 2 and 3), which may be the input terminal, is connected via an input lead 30 through the capacitor 20 to contact T3 of capacitor 20. The input lead 30, which is shielded within shielding compartment 26, passes through a vertical opening or slot $24^a$ in shield wall 24 and through a longitudinal hole in capacitor 20 to connect with contact T3. Contact T5 is connected over part of the slot $24^a$ in the shield wall 24 and includes a short lead or metal strip 31 (Fig. 6) soldered or pressed over the remaining portion of the slot $24^a$ to completely cover the opening in the shield wall 24. Contact T3 is connected via a lead 32 to choke coil 18, the other end of choke coil 18 being connected to contact T4 of capacitor 20 by a lead 33. Terminal 29, which may be the output terminal, is connected to contact T4 of capacitor 19 via an output lead 34 which goes through a vertical opening or slot $25^a$ in shield wall 25 and through a longitudinal hole in capacitor 19 to contact T4. The output lead 34 is shielded within shielding compartment 27 between the shield wall 25 and the contact T1. Contact T6 is connected over part of the slot $25^a$ of the shield wall 25 and includes a short metal strip 35 soldered or pressed over the remaining portion of the slot $25^a$ to completely cover the opening in the shield wall 25. Thus the electrical connections of the network are equivalent to that in Fig. 1, the capacitors 19 and 20 each having one electrode thereof grounded via the shield walls 24 and 25, the other electrodes of the capacitors 19 and 20 being connected to either end of choke coil 18 and to the terminals 29 and 28, respectively.

The compartment forming shield walls 24 and 25 are each similar in construction. As shown in Fig. 8, shield wall 25 is formed from a single metal strip and is constituted by a rectangular wall having a vertical slot $25^a$ to permit passage of the input lead, one end of the wall being provided with an integral flange $25^b$ extending perpendicularly therefrom in one direction, the other end of the wall being provided with a right-angled bracket portion $25^c$ extending in the opposite direction. As seen in Fig. 4, flange $25^b$ is soldered or otherwise electrically connected to the side wall $21^a$ of can 21 while bracket $25^c$ is electrically attached to the end wall of the can 21 to define the radio frequency shielding compartment 27 within the can 21.

The terminals 28 and 29 are of similar construction and, as seen in Fig. 4, terminal 29 includes an external soldering lugs $29^a$ which is connected to a metal tube $29^b$ extending into the compartment and surrounded by an insulating bushing $29^c$ formed of glass, plastic or other suitable dielectric material. The invention does not reside in the construction of the terminal and any conventional terminal element may be used for the purpose.

It will be seen that not only are the choke coil 18 and the capacitors 19 and 20 forming the filter network housed within a shielding can (Fig. 3), but the input lead 30 and the output lead 34 are contained within separate electrical shielding compartments 26 and 27 and are electrically shielded and isolated from each other.

Further, as shown in Fig. 3, a portion of the electrode at one end of each capacitor is arranged over the opening in the associated shield wall through which the lead passes to further shield the lead. Thus, if a slot is used as the opening as is illustrated in Fig. 6 and a metal tab or strip is used to cover one portion of the slot, the electrode then covers the opening which comprises the remaining portion of the slot.

Moreover, as the terminals 28 and 29 are disposed adjacent diagonally opposed corners of the can 21 and as the radio frequency shielding compartments include these corners, the input and output leads within the can are separated from each other the maximum possible distance. In addition, the use of non-inductive feed-thru capacitors in the filter assembly makes it possible to reduce substantially the length of the capacitor leads and the connecting wires in the network. All these factors operate to minimize stray coupling effects between the input and output leads to the greatest possible extent, whereby a high degree of attenuation is maintained even in the high-frequency portion of the interference signal range. As compared with a conventional filter device wherein the attenuation obtained in the range of approximately 600 kc. to 1000 mc. was in the order of 40 decibels and lower, with the present invention an attenuation of 80 decibels and greater was obtained in the same range.

It is to be understood that the invention is not limited to filter devices formed by "Pi" connected networks, but that other networks such as the "L" type may also be used with equally successful results. Also, only one terminal and lead might be shielded and still providing higher attenuation than that of the conventional circuit.

It is to be understood that a multiplicity of these filter networks may also be included in one metallic housing.

In summary, an improved filter has been provided which attenuates a wide frequency range of interfering signals and which is highly compact and yet which may be manufactured and sold at a reasonable cost.

While we have illustrated and described the preferred embodiment of our invention, it is to be understood that we do not limit ourselves to the precise construction herein disclosed and the right is reserved to all changes and modifications coming within the scope of the invention as defined in the appended claims.

What is claimed is:

Having thus described our invention, what we claim as new, and desire to secure by United States Letters Patent is:

1. A filter comprising a metallic housing having first and second openings, first and second terminals mounted at said first and second openings respectively in insulated relationship with said housing, said first and second terminals being located to avoid coupling of radio frequency energy between said first and second terminals on the outside of said metallic housing, a shield wall connected in permanent electrical contact with the inside of said metallic housing between said first and second openings, said shield wall forming a radio frequency shielding compartment about one of said openings to shield said one of said openings from the other of said openings, said shield wall having an opening, a feed-thru capacitor positioned within said metallic housing and outside of said radio frequency shielding compartment, said feed-thru capacitor comprising a pair of electrodes and a lead which feeds through the capacitor and is connected to one of the electrodes, the lead at one end of said feed-thru capacitor passing through the opening in said shield wall into said radio frequency shielding compartment and connecting to said one of said terminals, shield means comprising the other electrode for shielding the opening in said shield wall and the lead between said shield wall on the outside of said radio frequency shielding compartment and the other end of said feed-thru capacitor, said shield means being electrically connected to said shield wall, and means connecting the lead at said other end of said feed-thru capacitor to said second terminal.

2. The filter of claim 1 wherein said other electrode substantially surrounds and shields said opening in said shield wall.

3. The filter of claim 1 wherein said metallic housing is multi-sided and said first and second terminals are located on different sides of said metallic housing.

4. The filter of claim 1 wherein said metallic housing has a pair of opposite sides and said first and second terminals are located on said opposite sides of said metallic housing.

5. The filter of claim 1 wherein said feed-thru capacitor is of the wound type.

6. The filter of claim 1 wherein said feed-thru capacitor is of the electrolytic type.

7. A filter comprising a metallic housing having first and second openings, first and second terminals mounted at said first and second openings respectively in insulated relationship with said metallic housing, said first and second terminals being located to minimize the coupling of radio frequency energy from one to the other outside said metallic housing, a first shield wall connected in permanent electrical contact with the inside of said metallic housing between said first and second openings, said first shield wall forming a radio frequency shielding compartment about said first opening to shield said first opening, a second shield wall connected in permanent electrical contact with the inside of said metallic housing between said second opening and said first shield wall forming a radio frequency shielding compartment about said second opening to shield said second opening, each of said shield walls having an opening, first and second feed-thru capacitors positioned within said metallic housing and outside of said radio frequency shielding compartments, each of said feed-thru capacitors comprising a pair of electrodes and a lead which feeds through the capacitor and is connected to one of the electrodes, and the lead at one end of each of said feed-thru capacitors passing through the associated opening and connecting within the associated radio frequency shielding compartment to the associated terminal, first and second shield means each comprising the other electrode of each of said first and second feed-thru capacitors for shielding the opening in each of said first and second shield walls respectively and the associated lead between the associated shield wall on the outside of the associated radio frequency shielding compartment and the other end of the associated feed-thru capacitor, said first and second shield means being electrically connected to said first and second shield walls respectively, and an inductor connected between the leads at said other end of each of said feed-thru capacitors.

8. The filter of claim 7 wherein said other electrode of each of said first and second feed-thru capacitors substantially surrounds and shields the opening in the associated shield wall.

9. The filter of claim 7 wherein said metallic housing is multi-sided and said first and second terminals are located on different sides of said metallic housing.

10. The filter of claim 7 wherein said metallic housing has a pair of opposite sides and said first and second terminals are located on said opposite sides of said metallic housing.

11. The filter of claim 7 wherein said first and second feed-thru capacitors are of the wound type.

12. The filter of claim 7 wherein said first and second feed-thru capacitors are of the electrolytic type.

13. A filter comprising a metallic housing of rectangular cross-section having first and second openings, first and second terminals mounted in said first and second openings respectively in insulated relationship with said metallic housing, said first and second terminals being located on opposite sides and opposite corners of said metallic housing to minimize the coupling of radio frequency energy from one to the other outside said metallic housing, a first shield wall connected between said first and second terminals in permanent electrical contact with the inside of said metallic housing with a major portion of said shield wall parallel to the associated side of said metallic housing, said first shield wall forming a radio frequency shielding compartment about said first terminal to shield said first terminal, a second shield wall connected between said second terminal and said first shield wall in permanent electrical contact with the inside of said metallic housing with a major portion of said shield wall parallel to the associated side of said metallic housing, said second shield wall forming a radio frequency shielding compartment about said second terminal to shield said second terminal, each of said shield walls having an opening, first and second feed-thru capacitors positioned within said metallic housing and outside of said radio frequency shielding compartments, each of said feed-thru capacitors comprising a pair of electrodes and a lead which feeds through the capacitor and is connected to one of the electrodes, the other electrode of each of said first and second feed-thru capacitors being in permanent electrical contact with said first and second shield walls respectively outside of the associated radio frequency shielding compartment to substantially surround and shield the associated opening, the lead at one end of each of said feed-thru capacitors passing through the associated opening and connecting within the associated radio frequency shielding compartment to the associated terminal, and an inductor connected between the leads at the other end of each of said feed-thru capacitors.

14. The filter of claim 13 with said first and second feed-thru capacitors and said inductor being arranged in parallel relation, and a mounting screw attached to and projecting from said metallic housing.

15. The filter of claim 13 wherein said first and second feed-thru capacitors are of the wound type.

16. The filter of claim 13 wherein said first and second feed-thru capacitors are of the electrolytic type.

References Cited in the file of this patent

UNITED STATES PATENTS

| | | |
|---|---|---|
| 1,747,938 | Hull | Feb. 18, 1930 |
| 2,346,162 | Hanopol | Apr. 11, 1944 |
| 2,388,054 | Hartzell | Oct. 30, 1945 |
| 2,491,681 | Minter | Dec. 20, 1949 |
| 2,569,667 | Harvey et al. | Oct. 2, 1951 |

FOREIGN PATENTS

| | | |
|---|---|---|
| 367,414 | Italy | Sept. 29, 1937 |

UNITED STATES PATENT OFFICE
CERTIFICATE OF CORRECTION

Patent No. 2,835,874 May 20, 1958

Mervin H. First et al.

It is hereby certified that error appears in the printed specification of the above numbered patent requiring correction and that the said Letters Patent should read as corrected below.

Column 3, line 41, strike out "a", first occurrence; line 57, for "(Figs. 3)" read --(Fig. 3)--; column 4, line 46, for "lugs" read --lug--; column 5, line 13, for "providing" read --provide--; line 27, strike out "What is claimed is:"; column 6, line 21, strike out "and".

Signed and sealed this 14th day of October 1958.

(SEAL)
Attest:
KARL H. AXLINE
Attesting Officer

ROBERT C. WATSON
Commissioner of Patents